US007799865B2

(12) United States Patent
Ledwidge et al.

(10) Patent No.: US 7,799,865 B2
(45) Date of Patent: Sep. 21, 2010

(54) RAPIDLY CURING FORMULATIONS INCLUDING A CONDUCTIVE COMPONENT

(75) Inventors: Eadaoin D. Ledwidge, Lucan (IE); Harry J. Woolfson, Ranelagh (IE)

(73) Assignee: Loctite (R&D) Limited, Dublin (IE)

( * ) Notice: Subject to any disclaimer, the term of this patent is extended or adjusted under 35 U.S.C. 154(b) by 803 days.

(21) Appl. No.: 11/034,984

(22) Filed: Jan. 14, 2005

(65) Prior Publication Data

US 2005/0171273 A1 Aug. 4, 2005

(30) Foreign Application Priority Data

Feb. 2, 2004 (IE) .................................. 2004/0065

(51) Int. Cl.
*C08L 31/00* (2006.01)
*C08F 118/02* (2006.01)
*C08F 4/44* (2006.01)

(52) U.S. Cl. ................. 524/556; 526/319; 526/191

(58) Field of Classification Search ................. 524/556; 526/319, 191
See application file for complete search history.

(56) References Cited

U.S. PATENT DOCUMENTS

| 1,122,439 | A | * | 12/1914 | Taylor | 254/5 C |
| 3,940,362 | A | | 2/1976 | Overhults | 523/116 |
| 4,452,861 | A | * | 6/1984 | Okamoto et al. | 428/402.24 |
| 5,769,996 | A | | 6/1998 | McArdle | 156/272.4 |
| 5,851,644 | A | | 12/1998 | McArdle | 428/213 |
| 5,902,839 | A | * | 5/1999 | Lautenschlager et al. | 523/115 |
| 6,110,399 | A | | 8/2000 | McArdle | 252/513 |
| 6,149,857 | A | | 11/2000 | McArdle | 264/429 |
| 6,294,629 | B1 | | 9/2001 | O'Dwyer | 526/297 |
| 6,475,331 | B1 | | 11/2002 | O'Connor et al. | 156/331.2 |

FOREIGN PATENT DOCUMENTS

| EP | 659 441 | | 6/1995 |
| EP | 1 043 018 | | 10/2000 |
| GB | 1122439 | * | 8/1968 |
| JP | 60115678 A | | 6/1985 |
| WO | WO 01/85861 | | 11/2001 |

* cited by examiner

*Primary Examiner*—William K Cheung
(74) *Attorney, Agent, or Firm*—Steven C. Bauman; James E. Piotrowski

(57) ABSTRACT

A curable composition for forming anisotropically conductive bonds comprising: (i) an amount of first substantially uncured curable component; (ii) conductive particles coated with a substantially uniformly thick coating of the cure product of a second curable component dispersed within the first curable cyanoacrylate component. The composition is suitable for use as an adhesive composition for bonding chips to electronic circuits. Desirably the first component and the second component are both cyanoacrylates.

20 Claims, 3 Drawing Sheets

RAPIDLY CURING FORMULATIONS INCLUDING A CONDUCTIVE COMPONENT

BACKGROUND TO THE INVENTION

1. Field of the Invention

The present invention relates to the field of curable compositions such as adhesives that include a conductive component and more particularly to acrylate, methacrylate and cyanoacrylate adhesives including such a component.

2. Brief Description of Related Technology

Many curable formulations, particularly cyanoacrylate—based ones, are cure sensitive to components one might introduce to such formulations. For example it is often desired to include components that will modify the physical properties of the formulation, for example tailoring the physical properties to a desired end-use application. It is often desired to include other components in adhesive formulations for various other reasons. It is sometimes difficult to incorporate these materials in the material without compromising at least one property of the composition, such as stability, for instance shelf life stability. On the other hand rapidly curing compositions are desirable for at least certain end-use applications.

Many techniques have been used to introduce additional materials into curable compositions without affecting the formulation stability. One of these ways is to encapsulate the component in some form, for example by the formation of microcapsules which hold at least one component internally and which operate as a physical barrier to separate components which might otherwise react to cause curing. Often a polymerizable monomer and/or a curative therefor are separated by microencapsulation.

One component that is often introduced into a composition is a conductive component. Many types of conductive components are known, many of which being in the form of particles. The particles may be regularly shaped or in the form of flakes. Often the conductive particle(s) is (are) used to create one or more conductive paths. Where a curable composition is used to bond two components together it is often at times desirable that the composition does not form (when cured) an insulator between components. For example when bonding substrates, such as where an electronics component is to be bonded to a circuit board [such as a printed circuit board ("PCB")] it is usually desirable that the composition when cured conducts electricity between the substrates.

It is desirable also in many cases for the formulation to form one or more anisotropic conductive pathways. In particular it is desirable that the composition does not short circuit the component assembly in any way (for example shorting between the pins of an electronic component). Many formulations have been devised where anisotropic effects have been achieved, of which some include non-random ordering of the particles. Many of these are formed in (conductive) monolayers for example using magnetic ordering.

U.S. Pat. No. 6,149,857 (McArdle) describes an anisotropically-conductive film or a substrate having a surface coated with an anisotropically-conductive coating. The film or coating is formed by solidifying a composition comprising (i) a solidifiable ferrofluid composition and (ii) a plurality of electrically-conductive particles, dispersed in the ferrofluid. The ferrofluid comprises a colloidal suspension of ferromagnetic particles in a non-magnetic carrier. The electrically-conductive particles are arrayed in a non-random pattern by application of a substantially uniform magnetic field to the composition in a liquid state and are locked in position by solidification of the composition. The composition is solidified in an A-stage, usually involving a primary cure. In end-use application of the film or coating, the composition usually undergoes a B-stage or secondary cure. The film or coated substrate is an article of manufacture for bonding conductors in the electronics industry. Similar technologies are described in U.S. Pat. Nos. 6,110,399, 5,851,644, and 5,769,996 all to McArdle.

In an unrelated field relating to topical transdermal treatments, European Patent Publication No. EP 1 043 018 (L'Oreal) discloses a patch which comprises a polymeric matrix and with an adhesive surface. The patch also includes dispersed magnetic particles. A method of preparation of the particles is also disclosed.

In another unrelated field of dental compositions, Great Britain Patent Publication No. GB 1,122,439 (Mitsuharu Takeuchi) describes the incorporation of dentally acceptable solid material in dental compositions. In the Examples monomeric ethyl cyanoacrylate is placed in pits and fissures in the teeth. Where the cyanoacrylate contacts a surface it is described as polymerising instantly while other of the material remains pasty in consistency. To the part of the composition which remains pasty a powdery mixture of methyl methacrylate polymer and metallic particles (such as gold) are added. The composition hardens within a minute after which time it is shaped. Coating of the particles is also mentioned. Coating is achieved by placing particles in an amount of liquid methyl methacrylate, heating, drying and pulverising.

U.S. Pat. No. 4,452,861 (Okamoto) describes solid particles encapsulated with cyanoacrylate polymer. The particles are encapsulated to prevent degradation due to reactive or corrosive surroundings. The cyanoacrylate polymer is used to coat phosphor particles and the like which are employed as coatings in cathode ray tubes and the like. Cerium activated calcium sulphide phosphor powder is the exemplified material which is coated.

Notwithstanding the state-of-the-technology, it would be desirable to provide a curable composition that is suitable for use in bonding electronic components which has a fast cure profile and desirable end-use physical properties. In particular it is desirable to provide a curable composition that can form conductive bonds between two substrates that are bonded together by the composition.

SUMMARY OF THE INVENTION

The present invention thus provides a curable composition for forming anisotropically conductive bonds comprising:

(i) an amount of first substantially uncured curable component;

(ii) conductive particles coated with a (substantially uniformly thick) coating of the cure product of a second curable component dispersed within the first curable component.

The compositions of the invention form, on cure, reliable anisotropic bonds that are quick to form and reliable in use.

The cure product of said second curable component has as one of its functions the task of physically isolating said conductive particles from said first curable component. In this respect a coating that is substantially insoluble in the first curable component is desirable. The coating may become more soluble at elevated temperatures (for example 60° C. or higher). A further function of the coating may be to insulate the particle so that it cannot conduct electricity.

Bonds with at least certain of the compositions of the invention can be formed in less than 5 seconds and typically less than 1 or 2 seconds. In general the bonds formed are formed quickly—so called "instant" bonding.

In general the physical barrier of the coating will ensure that cure will not take place while the composition is being stored for use.

The curable components for use in formulations of the invention are desirably selected from the group consisting of acrylates, methacrylates and cyanoacrylates and combinations thereof.

Many acrylates, methacrylates and in particular cyanoacrylates, cure on exposure to conductive materials such as metals. Accordingly it is desirable to prevent premature cure of the compositions of the invention this is cure before the composition/substrates to be bonded are positioned for use. Once the composition of the invention is in place for curing it may cure on contact with the surface to which it is applied. Instances where the compositions of the invention set up or cure without anything other than contact with a substrate being required include those where the composition is applied to certain substrates, for example to metallic (e.g., copper) tracks/pads or the like.

Additionally or alternatively cure may be promoted where the coating of at least some of the particles is at least partially removed so as to expose the first curable component to the conductive material. In such cases contact with the conductive material may be sufficient to promote curing. The coating may be at least partially removed by physically breaking the coating (for example by applying sufficient pressure to the particle to deform it to cause breaking of the coating).

In certain applications the particles will be pressed between two substrates, for example between two conductive substrates, so that the particle must be sufficiently uncoated to form a conductive pathway between the substrates it bridges. Such a scenario is typical where one substrate is pressed onto the other and the adhesive composition is between the substrates. In such circumstances the bringing together of the substrates may be sufficient to "flatten" (deform by pressing upon) the particle and break the coating sufficiently.

Additionally/alternatively the coating may be otherwise at least partially removed such as by dissolution in the composition, such as where elevated temperatures are applied.

It will be apparent to those skilled in the art that the anisotropic pathways formed by at least certain of the particles of the composition are not formed until the coating of the particles is at least partially removed (as the coating may also be electrically insulating). In some cases all of the particles will have the coating removed (e.g., when exposed to elevated temperatures). To that extent if only certain of the particles have the coating removed, those certain particles will form the anisotropically conductive pathways. It will be quite common therefore to have at least certain regions of the composition where the particles remain coated and therefore non-conductive and other regions where the particles become conductive by removal of the coating. The localisation of the conductive particles with the removed coating may be by itself sufficient to always ensure anisotropic conductivity.

On the other hand the "loading" of the particles in the composition may also be used as a further control factor. In short the loading of the particles is sufficiently low to ensure that the particles do not form a short circuit across a gap by contacting each other to form a conductive path across that gap even in the event that all of the particles become uncoated. Particles that remain coated will be non-conductive. Desirably the loading of the particles is in the range from about 0.1 to about 30% by volume with respect to the volume of the first component desirably in the range from about 0.5 to about 15% for example in the range from about 1 to about 10% typically from about 3 to about 7%.

Desirably at least the first curable component is a cyanoacrylate.

Desirably the composition is a one-part composition.

The coated particles may be mono-sized, i.e., substantially of the same dimensions. This may be important if the bond gap formed is desirably of a particular size. However particles of varying dimensions can be used for example tin/bismuth (spherical) particles may be provided with a relatively wide distribution of diameters about a mean value such as from about 3 μm to about 15 μm. In particular, it is desirable that the coated particles are spherical in shape.

Desirably the coating on the particles is less than about 5 μm more particularly in the range from about 0.01 to about 3.0 μm such as from 0.04 to about 2.2 μm for example from about 0.1 to about 2.2 μm.

The composition is absent of the presence of particles formed by cured second curable component. In other words the composition comprises only a dispersion of coated particles. The dispersed material does not include particles entirely formed of cured second curable component (coating) material.

In the present invention the curable compositions provided are advantageous as the presence of the coating on the conductive particles lends to the stability of the composition by mitigating against the reactivity of the conductive particles towards the first curable component. The conductive particles are thus physically prevented by the coating of the second curable component from causing premature cure of the composition. The compositions of the invention generally have high cure strengths and are fast curing. The conductive particles can be considered pre-coated with the cure product of the (second) curable component.

It will be appreciated that the first curable component may comprise a combination of curable materials (e.g., a mixture of monomeric materials). The same applies also to the second curable component.

The compositions of the invention can be employed in many applications. One of the main end uses will be in the electronics industry generally and in particular in applications that require the formation of conductive bonds, such as is in flip-chip applications.

The compositions of the invention are particularly useful for the bonding of semiconductor chips to substrates. More particularly the compositions of the invention are useful for bonding semiconductor chips (for example so called "smart-chips") to circuits to which it is desirable to connect them. The compositions of the invention may be used to bond said chips to one or more conductive pads. In particular it is desirable to create a fast and enduring bond between the chip and the pad(s). The compositions of the invention are also anisotropically conductive in end-use application and as a result of the fact that there is no cross-talk between the conductive particles and thus no undesired shorting.

In one particular arrangement it has been found that the composition of the invention works very well where the first curable component is a cyanoacrylate and the second curable component is also a cyanoacrylate. Desirably the first and second curable components are different cyanoacrylates.

In this respect the present invention also includes a curable composition comprising:

(i) an amount of a first substantially uncured curable cyanoacrylate component; and (ii) conductive particles coated with the cure product of a second cyanoacrylate component dispersed within the first curable cyanoacrylate component.

The composition is suitable for forming anisotropically conductive bonds.

It is desirable that in the compositions of the invention that the cure product of the second curable component is stable on dispersion of the coated conductive particles into the formulation which will comprise the substantially uncured first curable component. One observation of the present inventors is that the coating formed should substantially remain on the conductive particles and should not migrate to any substantial extent into the remainder of the formulation whether by dissolution or any other physical process. One could consider therefore that the cure product is not soluble to any substantial extent in the monomer in which it is dispersed (as a coating on the conductive particles).

In a particularly desirable embodiment the second conductive component (i.e., material used to coat the conductive particles) comprises methyl cyanoacrylate. The first curable component usefully comprises ethyl cyanoacrylate. Methyl cyanoacrylate forms a relatively insoluble polymer (in other acrylates and in particular in higher cyanoacrylates) and thus is a particularly desirable component. Methyl cyanoacrylate is surface sensitive. When applied to the particles it tends to cure rapidly over the surface. Due to these properties it is very desirable as the (second) curable component.

Cyanoacrylates in particular are very sensitive to the presence of metals and tend to cure rapidly when contacted with metal surfaces. Accordingly it is particularly advantageous to be able to provide a cyanoacrylate composition that includes conductive particles (such as metallic ones), which composition does not cure prematurely.

Suitable cyanoacrylate monomers are alkyl, alkenyl and alkoxy cyanoacrylate esters, more particularly where the alkyl or alkenyl group of such esters has up to 10 carbon atoms, especially up to 5 carbon atoms. The cyanoacrylate monomer(s) may be selected from methyl, ethyl, n-propyl, iso-propyl, n-butyl, iso-butyl, sec-butyl, tert-butyl, n-pentyl, iso-pentyl, n-hexyl, iso-hexyl, n-heptyl, iso-heptyl, n-octyl, n-nonyl, allyl, methoxyethyl, ethoxyethyl, 3-methoxybutyl and methoxyisopropyl cyanoacrylate esters.

Suitable polymerizable acrylate ester monomers may be monofunctional or a combination of mono- and polyfunctional monomers. Generally, the monomers are exemplified but not limited to those selected from alkyl acrylates, cycloalkyl acrylates, alkyl methacrylates, cycloalkyl methacrylates, alkoxy acrylates, alkoxy methacrylates, alkylene diacrylates and alkylene dimethacrylates. Among the preferred monofunctional monomers are methyl methacrylate, lauryl methacrylate, 2-ethyl hexyl methacrylate, ethyl methacrylate, n-butyl methacrylate, iso-butyl methacrylate and t-butyl methacrylate. Desirable monomers which have high boiling points and low volatility characteristics, including such monomers as tetrahydrofurfuryl methacrylate, cyclohexyl methacrylate, isobornyl methacrylate, hydroxyethyl methacrylate and hydroxypropyl methacrylate.

The monofunctional monomers mentioned above may generally be represented by the formula:

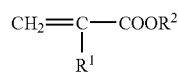

where $R^1$ is H, $CH_3$ or $C_1$-$C_6$ alkyl, $R_2$ is H, $C_1$-$C_{20}$ alkyl, $C_1$-$C_{20}$ alkoxy, $C_3$-$C_{20}$ cycloalkyl, or $C_2$-$C_{20}$ alkylene group.

In general the first curable component forms the main part of the composition and represents any of the composition not taken up by the coated particles and where present other components.

If desired an accelerator for the first curable component, can be included in the composition. The compositions of the invention are desirably stable under storage at ambient conditions. Such compositions will normally be formulated so as to cure on contact with a substrate to be bonded. However the compositions of the invention may be, if desirable, formulated so that they have a cure temperature of above about 40° C. preferably above 50° C. more desirably above 80° C. such as around 100° C. An elevated temperature may be employed to accelerate cure.

In order to make the composition stable to high temperatures it may be necessary to further include a stabiliser component. For example the composition may include at least one a radical stabiliser and an anionic stabiliser. The stabiliser component may comprise a combination of stabilisers.

Typical radical stabilisers include hydroquinone and other phenolic stabilisers such as those disclosed in the context of cyanoacrylate compositions, irradiated to confer sterilization for biomedical indications, see e.g. European Patent Publication No. EP 0 659 441 A1 (McDonnell) which is hereby incorporated in its entirety by reference.

Other stabilisers include $SO_2$, and sources thereof, and methane sulphonic acid ("MSA"). For the high temperature stability the amounts of stabilizer(s) that are included in the composition may be higher than the normal amounts chosen in the case that the composition was chosen to cure at a lower temperature.

Suitable inhibitors or stabilizers include anionic polymerisation inhibitors such as sulphur dioxide, nitrogen oxide, boron trifluoride and its complexes, chlorosulphonic acid, methane sulphonic acid, hydroxypropane sulphonic acid, benzenesulphonic acid, p-toluene sulphonic acid, trifluoromethane sulphonic acid, and hydrogen fluoride. Free radical stabilisers include for instance hydroquinone, monomethyl ether of hydroquinone, nitrohydroquinone, catechol, pyrogallol, t-butyl hydroquinone, and butylated hydroxyanisole.

The compositions of the present invention may be considered to be anisotropically conductive. That is, the inventive compositions are conductive in one direction, desirably in the direction of the depth of a bond formed therefrom between two substrates.

In particular a major advantage of the compositions of the present invention is that ordering of the conductive particles is not necessary. This is particularly the case where the pitch between components or parts of components to be bonded is such so that sufficient dispersion of the particles will achieve the anisotropic effect. For finer pitches ordering can be achieved if necessary.

The cure speed of the compositions of the invention is high particularly where the first curable component is a cyanoacrylate. In fact cure speed of the compositions of the invention may be cure sufficiently quickly to allow the composition of the invention to be employed in an in-line assembly process, as a sufficient bond strength may be reached quickly.

Any type/shape of conductive particle may be used. In particular the particles may be spherical. Suitable materials for forming the conductive particle are any good conductive materials including metals. Of particular interest in the present invention are gold and nickel particles. In this respect the term "gold", "nickel" "metal" or other such references to the material from which particles are constructed is used to include particles comprised entirely of the material (or combinations of materials), or particles formed by coating that material (or combinations of materials) onto a substrate such as a polymeric substrate, so as to form for instance a conductive coated (polymeric) particle. For example where spherical particles are employed the material could for example be gold metal applied to a base substrate of polymeric material (e.g., plastic balls or microspheres). The metal particle or metal coated particle forms a conductive pathway when bonded between two substrates. Suitable metallic materials for use include alloys for example tin/bismuth, tin/lead and tin/indium/bismuth alloys.

The size of such particles may be from about 0.5 to about 100 μm in at least one dimension.

The particles may include combinations of different conductive materials applied to either any given particle or to distinct particles or mixtures of various types of such particles.

It is desirable to provide the compositions of the invention as anisotropic conductive pastes ("ACPs"). For ACPs and indeed for other applications it may be desirable to also include in the compositions of the invention an amount of thickener. A thickener component may be thus added to the composition to increase viscosity. One of the functions of an added thickener is to allow for retained dispersion of the (coated conductive) particles through the composition. If the composition is not sufficiently resistant to movement of the particles they will tend to settle out of their dispersed state.

Suitable thickening agents are poly-alpha-cyanoacrylates, polyacrylates, polyalkylmethacrylates, cellulose acetates, and similar cellulose esters, polylactic acid, polyglycolic acid, lactic-glycolic acid copolymers, polycaprolactone, lactic acid-caprolactone copolymers, poly-3-hydroxybutyric acid, polyorthoesters, polyalkyl acrylates, copolymers of alkylacrylate and vinyl acetate, copolymers of alkyl methacrylates and butadiene as well as other polymer materials which do not react with the monomers causing premature polymerisation and which preferably can be mixed with said monomers.

Plasticisers may also be added to the compositions of the invention in desired amounts. Examples of suitable plasticisers include the esters of cyanoacetic acid, succinic acid, sebacic acid and phthalic acid; tributyl phthalate, dioctyl phthalate, dioctyl adipate, dioctyl glutarate, trioctyl trimellitate, isopropyl myristate, butyl stearate, lauric glycerine triacetate, and glycerine tributyrate.

To improve the cohesive strength of adhesive bonds formed from the compositions of this invention, difunctional monomeric crosslinking agents may be added to the substantially uncured composition. Such crosslinking agents are known to those skilled in the art. Reference is made to U.S. Pat. No. 3,940,362 (Overhults) which is hereby incorporated in its entirety by reference. Examples of suitable crosslinking agents include alkyl bis(2-cyanoacrylates), triallyl isocyanurates, alkylene diacrylates, alkylene dimethylacrylates, and trimethylol propane triacrylate.

The compositions of this invention may further contain dyes and pigments.

Examples of suitable colourants include 1-hydroxy-4-[4-methyl-phenylamino]-9,10 antracenedione (D+C Violet No. 2); disodium salt of 6-hydroxy-5-[(4-sulfophenyl)axo]-2-naphthylenesulphonic acid (FD+C Yellow No. 6); 9-(o-carboxyphenyl)-6-hydroxy-2,4,5,7-tetraiodo-3H-xanthenen-3-one, disodium salt, monohydrate (FD+C Red No. 3); 2-(13dihydro-3-oxo-5-sulfo-2H-indole-2-ylidine)-2,3-dihydro-3-oxo-1H-indole-5-sulfonic acid disodium salt (FD+C Blue No. 2); and phthalocyaninato (2-) copper. (FD+C is the category of dyes and pigments considered safe for drugs and cosmetics by the US FDA when in contact with mucous membranes or when ingested.)

Cure accelerator materials may be employed for use with the present invention. These include the accelerator materials disclosed in International Application/Publication No. PCT/IE02/00157 and WO 01/85861 to the present applicants/assignees both of which are hereby incorporated in their entirety by reference. Other examples of accelerators suitable for use with the present invention include U.S. Pat. No. 6,475,331 (Grismala) and U.S. Pat. No. 6,294,629 (O'Dwyer) both of which are hereby incorporated in their entirety by reference. Certain of the accelerator compositions may be used as primers to prime a substrate for subsequent bonding with a composition according to the present invention.

The skilled person will know the amounts and types of additional components that can be employed in the compositions in the invention for optimisation for any end use application.

The compositions of the invention may also be formulated so as to be reworkable; that is they are easily removable by heat and/or solvent to allow re-bonding of a component where necessary for example in the case of a faulty component or a misalignment captures by the bonding process.

It is thought that the coating on the conductive particles is broken down when the composition is subjected to elevated temperatures. This means that the conductive particles do not lose their conductivity to any substantial extent by remaining partly or fully coated.

The compositions of the invention may be formulated in desired forms. One useful form of the compositions of the invention is paste form.

The invention also relates to a method of forming a composition of the invention which includes the steps of:

(i) applying a (second) curable component to conductive particles under suitable conditions so as to substantially (uniformly) coat the conductive particles with the cure product of the second curable component;

(ii) dispersing the so-formed coated particles in a (first) uncured curable component.

It is desirable that the conductive particles comprise a material which cures said second first curable component on contact. This allows for ease of application of the second curable component on the particles, for example, by a vapor deposition. By exposing the particles to the vapour of the acrylate component, a uniform coating of polymerised acrylate can be formed on the particles. Vapor deposition allows for uniform coatings to be applied to the particles. Typical coatings will typically be less that 1 μm thick. It will be appreciated by those skilled in the art that other methods of applying the coating are readily apparent such as placing particles in a substantially uncured amount of the second component.

The conductive particles may also cure the first curable component on contact. This facilitates curing of the first curable component when the coating of the second curable component has been at least partially removed from the particles. In many cases however, the first curable component will cure when deployed in its end use application.

In one embodiment of the invention the application of the (second) curable component to the conductive particles will also result in the cure of that component. For example in the case of cyanoacrylates the application of monomeric material to a metal (under the appropriate conditions) may be sufficient to cause cure of the cyanoacrylate without the need to take any further action or to add any additional components. The contact with the metal may be by itself enough to cause the cure product to form.

One very simple method of application of (the cured product of) the (second) curable component to the conductive particles is by exposure to vapour of that curable component (i.e., vapor deposition). For example, the particles may be exposed to any suitable vapor arising at ambient temperature, or the temperature may be suitably raised to create the vapor. In the case of acrylates, methacrylates, and in particular cyanoacrylates, the contact of the vapor with the surface of the particle may be sufficient to polymerize the monomeric material. In particular where the conductive material is metallic in nature the cure occurs quite readily.

For example a fluidized bed reactor may be employed for the preparation of the coated particles. A vapor of the (second) curable component may be injected into the fluid bed of the reactor.

The invention also relates to the use of a (second) curable component to coat by vapour deposition conductive particles for incorporation into a curable composition. Such compositions will give conductive pathways in their end use application.

The present invention also relates to a monolayer of a composition according to the present invention. The term "monolayer" refers to an amount of composition of the present invention applied to a substrate in such a manner to achieve a layer which has a distribution of individual particles so as to be substantially one particle thick. Generally all of the particles will be arranged substantially in the same plane so that the bond formed will have a height substantially equal to (or less than, if the particle is crushed during the bonding process) the largest dimension of the particles. In the case of substantially same-sized spherical particles the maximum thickness of the bond will generally correspond to the diameter of the coated particles.

The present invention also relates to an anisotropically conductive material, which is the cure product of a composition of the invention.

The invention also relates to an assembly comprising substrates joined by a composition of the present invention. More particularly it relates to a chip bonded to an electronic circuit by a composition of the present invention.

Certain embodiments of the invention will now be described in a non-limiting manner with reference to the drawings.

DETAILED DESCRIPTION OF THE INVENTION

Figure 1:
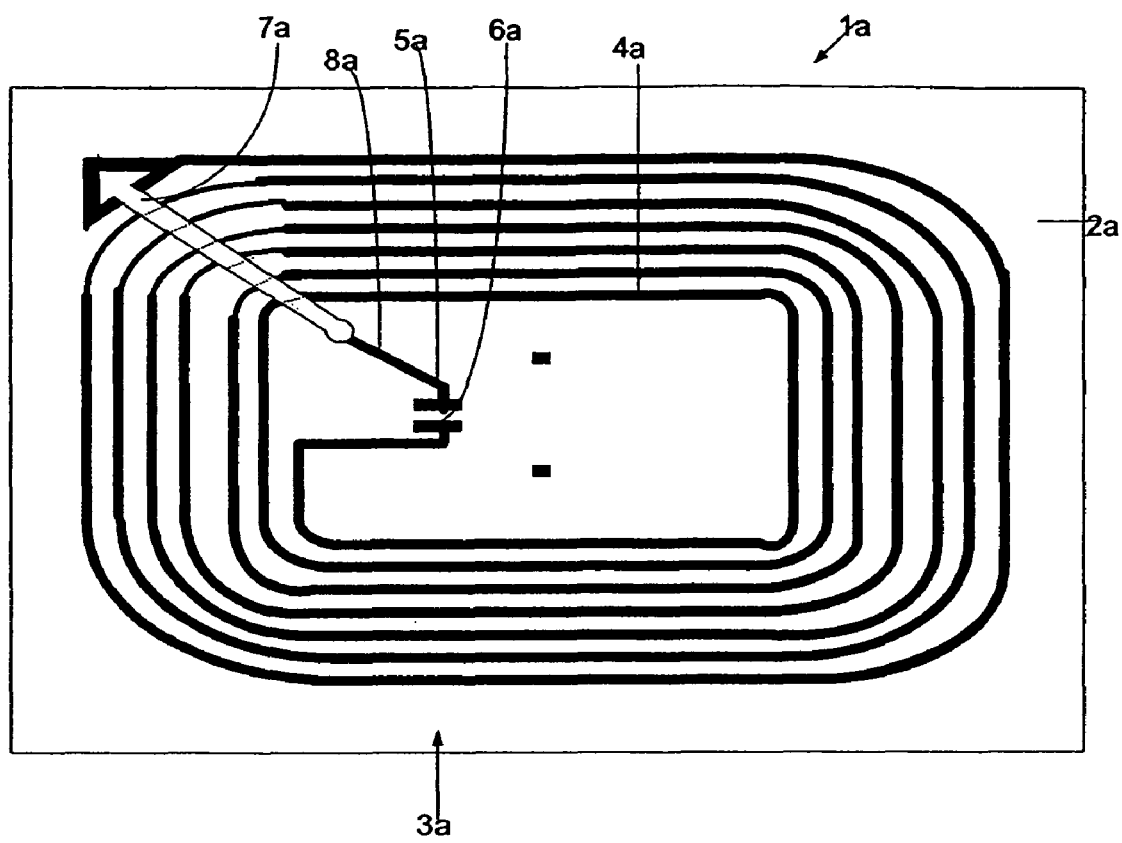
FIG. 1 shows a top (plan) view of an electronic circuit to which a semiconductor chip is to the bonded with the composition according to the present invention.

FIG. 1. depicts a schematic representation of an embodiment of the present invention in which a composition of the invention may be employed to bond a (surface mount component) electronic component to an electronic circuit.

FIG. 1 shows a device 1a, which comprises a flexible substrate in the form of a plastics substrate 2a on which an electronics circuit 3a has been laid down. The flexible substrate 2a comprises a layer of clear plastics material having a thickness of less than 1 mm. The plastics layer is generally transparent/translucent. The device has many end use applications such as for example as a smart label, which can be placed on products for identification/product information purposes. The entire device including the circuit is flexible.

The device 1 comprises a series of lines or tracks 4a which in the embodiment are made of copper and which are laid down in a concentric pattern. The device may be self-powering for example by current induced in the tracks 4a. As seen from FIG. 1. two opposing pads or contacts 5a and 6a are present and across which a smart-chip is to be fitted. The contact 5a is connected via a short track 8a to an aerial 7a which is for transmitting information to/from the chip.

Figure 2:
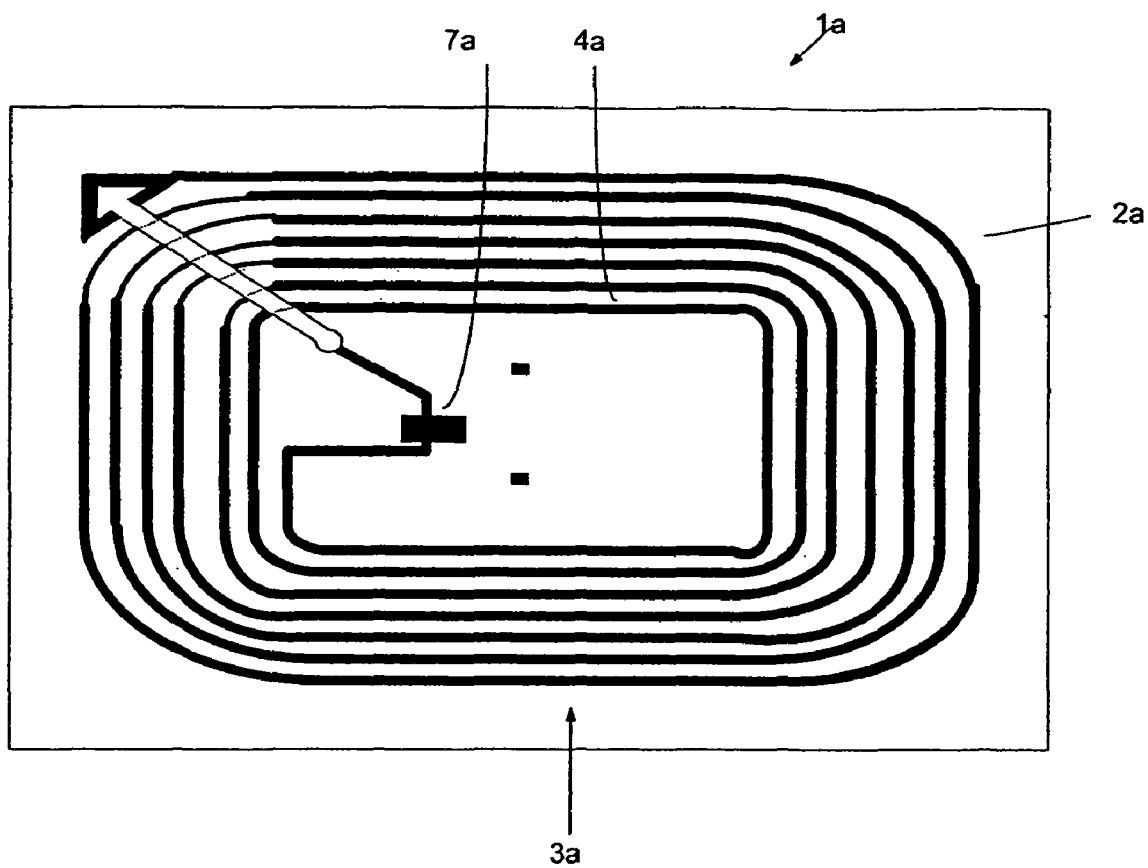
FIG. 2 shows the electronic circuit of FIG. 1 where the semiconductor chip has been a bonded in place.

As seen in FIG. 2 the chip 7a is attached across the pads or contacts 5a/6a. The chip 7a is bonded to the pads 5a/6a (and to the substrate 2a) by a composition of the present invention. The composition of the present invention instantly bonds the chip to the substrate when the two are brought into contact. The chip 7a is sufficiently pressed upon the pads/adhesive so that at least a certain amount of particles within the composition deform/are flattened between the contacts and the chip. The bond formed is thus anisotropic as conduction can take place via the particles between the chip and the contacts, but placing adhesive between the tracks 5a/6a does not short-circuit the device.

As above, end-uses of curable compositions of the present invention include bonding surface mount components to PCBs. In the electronics industry, it is desirable to provide compositions with thermal cure profiles tailored to specific application temperature requirements. Advances in the electronics industry have made precise deposition of surface mount adhesives a critical processing parameter, particularly in view of high throughput demand and process efficiency. The increasingly popular smaller-sized microelectronic components has made precise deposition of solder or adhesives onto circuit boards for chip attachment that much more important. Where precise adhesive deposition does not occur—either due to adhesive deposition technique imprecision, or spreading of the adhesive due to inappropriate rheological properties for the particular application, or both—surface mounting of components on PCBs may not occur at all, and even when mounting does occur, the mounting may not occur in a commercially-acceptable manner.

With certain applications, such as the applications in the electronics industry mentioned above, it has also become desirable for compositions used to bond electronic components to a desired substrate to have a defined structural integrity. One way to achieve this is through the addition of a thixotropy-conferring agent, such as a clay or a silica, a large number of which are well known. Indeed, Degussa makes available commercially a number of treated fumed silicas under the tradename "AEROSIL", and has suggested their use to impart a thickening and thixotropic effect. Other thixotropy conferring agents such as the polymeric thixotropic agents described above, may be used.

Certain of the adhesive compositions of the present invention are useful for mounting onto a circuit board semiconductor devices, such as chip size or chip scale packages ("CSPs"), ball grid arrays ("BGAs"), land grid arrays ("LGAs") and the like, each of which having a semiconductor chip, such as large scale integration ("LSI"), on a carrier substrate. Similarly, the compositions are useful for mounting onto circuit board semiconductor chips themselves.

Ordinarily, the CSP/BGA/LGA assembly is connected to electrical conductors on a circuit board by use of a solder connection or the like. However, when the resulting CSP/BGA/LGA/circuit board structure is exposed to thermal cycling, vibration, distortion or is dropped, the reliability of the solder connection between the circuit board and the CSP/BGA/LGA often becomes suspect.

Certain of the compositions of the invention enable a semiconductor device, such as a CSP/BGA/LGA assembly which includes a semiconductor chip mounted on a carrier substrate, to be securely connected to a circuit board and with conductive pathways where desired.

Where compositions of the invention are based on cyanoacrylates they will be curable by short-time heat curing and with good productivity. The bonds formed demonstrates excellent heat shock properties (or thermal cycle properties).

Conventional additives may also be used in the compositions of the present invention to achieve certain desired physical properties of the composition, the cured reaction product, or both. For instance, it may be desirable in certain instances to include a diluent. The rapidly curing compositions of the present invention may further contain other additives, such as defoaming agents, levelling agents, dyes and pigments.

The compositions of the present invention may be formulated as one-part compositions, in which all the ingredients are mixed together, or as a two-part composition, in which the (first) curable component and the curing agent are stored separately and mixed thereafter prior to use.

Accordingly, the curing agent used in the present invention can generally be any of the curing agents that are used in one-part and two-part formulations, particularly those noted above.

These inventive compositions also demonstrate a desired (relatively low) viscosity, at least under elevated temperature conditions. It is desirable to prepare the compositions by selecting the types and proportions of various ingredients to reach a viscosity at 25° C. of 10,000 mPa·s or less, such as 3,000-4,000 mPa·s.

Figure 4:
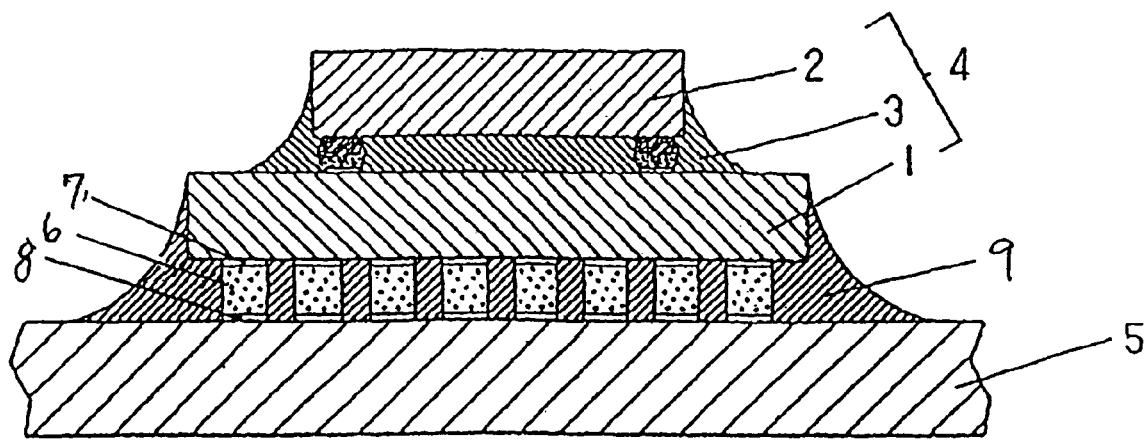
FIG. 4 depicts a cross-sectional view showing an example of a semiconductor device in which the composition of the present invention is used.
Figure 5:
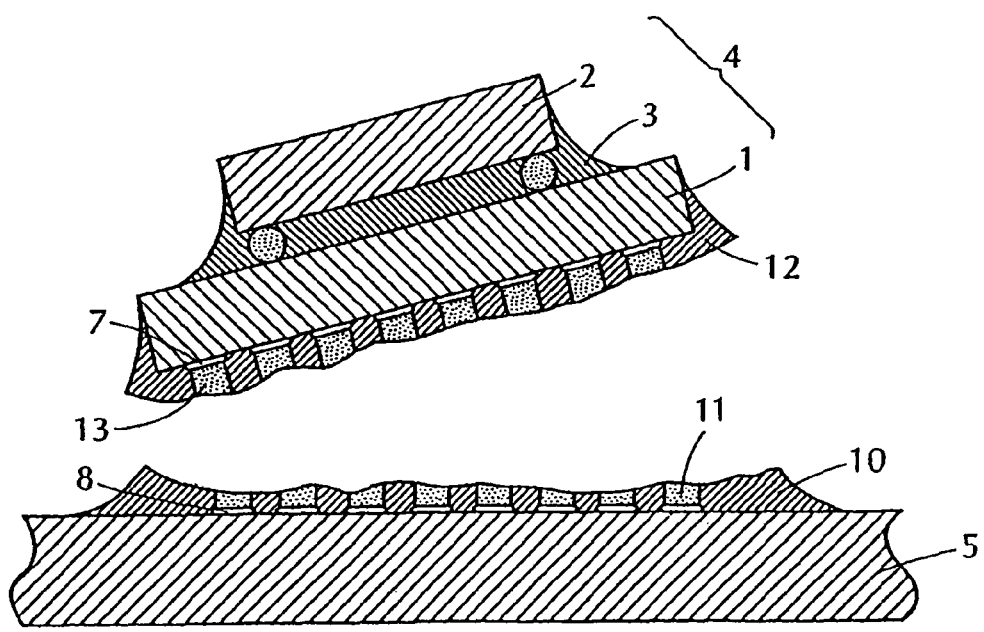
FIG. 5 depicts a cross-sectional view of a semiconductor device for attachment to a circuit board.

FIGS. 4 and 5 show an example of a semiconductor device mounting structure, such as a CSP, in which compositions of the present invention may be used.

The semiconductor device 4 is one formed by connecting a semiconductor chip (so-called bare chip) 2, such as LSI, to a carrier substrate 1 and sealing the space therebetween suitably with resin 3. This semiconductor device is mounted at a predetermined position of the circuit board 5, and electrodes 8 and 9 are electrically connected by a composition of the present invention. In order to improve reliability, the space between carrier substrate 1 and circuit board 5 may be sealed with the cured product 10 of a thermosetting resin composition. The cured product 10 of the thermosetting resin composition need not completely fill the space between carrier substrate 1 and circuit board 5, but may fill it to such an extent as to relieve stresses caused by thermal cycling. Bonding of a device to the board occurs when the composition of the present invention is subjected to elevated temperatures.

Carrier substrates may be constructed from ceramic substrates made of $Al_2O_3$, $SiN_3$ and mullite ($Al_2O_3$—$SiO_2$); substrates or tapes made of heat-resistant resins such as polyimides; glass-reinforced epoxy, ABS and phenolic substrates which are also used commonly as circuit boards; and the like.

As regards flip chip assemblies, reference to FIG. 5 shows a flip chip assembly in which a semiconductor chip has been mounted onto a circuit board using a composition of the present invention. The underfilling is sealed with a thermosetting resin composition.

The flip chip assembly 34 is formed by connecting a semiconductor chip (a bare chip) 32 to a circuit board 31 using a composition of the present invention. The bond is again formed by subjecting the assembly to elevated temperatures.

The space therebetween is suitably sealed with a thermosetting resin composition 33. This semiconductor device is mounted at a predetermined position on the circuit board 31 and electrodes 35 and 36 are electrically connected by a suitable electrical connection means 37 and 38, which in the present invention is a composition of the present invention. In order to improve reliability, the space between the semiconductor chip 32 and the circuit board 31 may be sealed with a thermosetting resin composition 33 and then cured. The cured product of the thermosetting resin composition should completely fill that space. In order to facilitate connections, the electrodes may be formed as bumps. Moreover, in order to improve the reliability and durability of connections, the space between the semiconductor chip and the carrier substrate may be sealed with a suitable resin. The semiconductor devices that can benefit from use of certain compositions of the present invention include CSPs, BGAs, and LGAs.

No particular limitation is placed on the type of circuit board used in the present invention, and there may be used any of various common circuit boards such as glass reinforced epoxy, ABS and phenolic boards.

Next, the mounting process is described below.

Initially, composition of the invention is printed at the necessary positions of a circuit board. Then, a semiconductor device is mounted in conformity with the pattern on the circuit board. The circuit board is exposed to elevated temperatures so as to activate the composition and thereby bond the semiconductor device. The electrical connection is thus made through an electrically conductive adhesive which can be considered anisotropically conductive. In order to facilitate subsequent repairs, the adhesive used can be chosen bearing in mind its melting point, bond strength and the like.

After the semiconductor device is electrically connected to the circuit board in this manner, the resulting structure should ordinarily be subjected to a continuity test or the like. After passing such test, the semiconductor device may be fixed thereto with a resin composition. In this way, in the event of a failure, it is easier to remove the semiconductor device before fixing it with the resin composition.

Then, using a suitable application means such as dispenser, a thermosetting resin composition is applied to the periphery of the semiconductor device. When this composition is applied to the semiconductor device, it penetrates into the space between the circuit board and the carrier substrate of the semiconductor device by capillary action.

Figure 3:
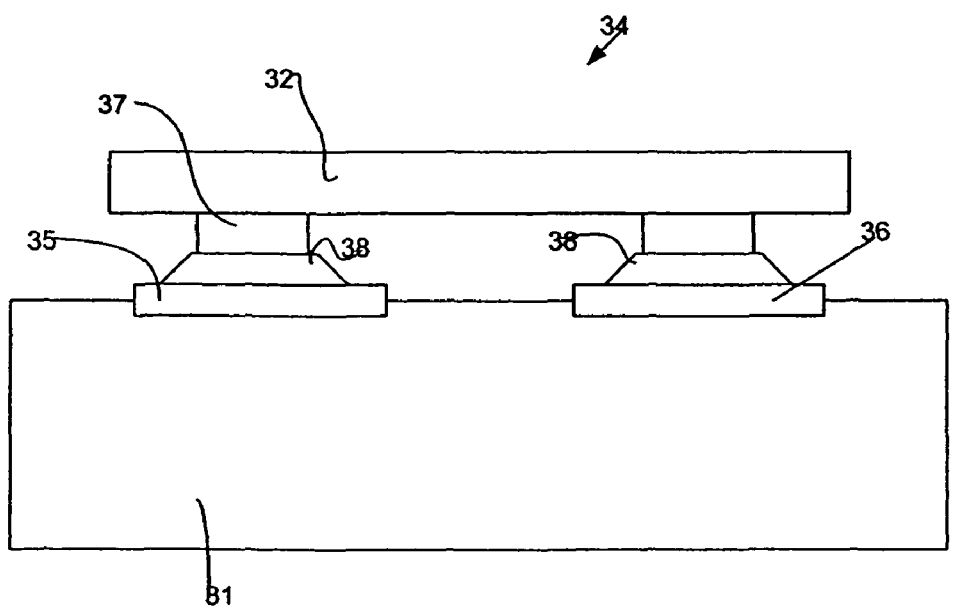
FIG. 3 depicts a cross-sectional view showing an example of a semiconductor flip chip assembly in which the composition of the present invention is used.

Next, the thermosetting resin composition is cured by the application of heat semiconductor device. When the thermosetting resin composition is used, it is usually cured by heating at a temperature of about 80° C. to about 150° C. for a period of time of about 5 to about 60 minutes. The semiconductor device mounting structure illustrated in FIG. 3 is completed in this manner.

The invention will be described now with reference to the following non-limiting Example(s).

EXAMPLES

Coating of the Conductive Particles

The conductive particles chosen were for our experimental work were JCI 24GNR4.6-EH sold under the trade name "Bright" by JCI of New York, N.Y., USA. JCI is a US subsidiary of Nippon Industrial Chemical Company Ltd. of Tokyo, Japan. These particles have a polymer centre believed to be polystyrene with an intermediary nickel coating and an outer coating of gold. The particles are substantially spherical with a mean diameter of 4.6 µm.

3.5 g of the particles were spread out in a boat (the boat is CA compatible) to an approximate monolayer. 1.11 g of methyl CA was placed in a lidded polypropylene tub. We then suspended the boat in the tub and the lid was replaced.

The tub/boat was left to stand for a period of 3 days. We agitated the particles every 24 hours to break up any clusters of particles that had become aggregated and for coating purposes.

After 3 days we examined a representative sample of the particles under a microscope at sufficient resolution to determine that the particles had an at least partial coating of methyl CA. This was determined by detecting a "halo" of material coated on the particles.

Formulation of Composition of the Present Invention

The (first) or base curable material of the composition was ethyl CA. All of the other components were dispersed in this component. The ethyl CA used in our formulation was produced by Henkel Loctite (Ireland) Ltd., Tallaght, Dublin 24, Ireland. The components of the composition were as follows: (all amounts percentage by weight of the entire composition throughout this specification unless otherwise stated)

| Component | Amount | Function |
| --- | --- | --- |
| Ethyl CA | 77.11 | First curable component |
| Hydroquinone | 0.38 | Stabilizer for elevated temperatures |
| PMMA | 17.01 | Thickener |
| Stabilizer which is a source of $SO_2$ | 2.5 | 2000 ppm $SO_2$ in Ethyl CA |
| Stabilizer which contains MSA | 3.0 | 1000 ppm MSA in Ethyl CA |

Because we intended the composition to be applied to a metallic substrate such as a gold track of a circuit board large amounts of stabiliser are used to prevent room temperature cure. The composition could be considered to be "overstabilised" as compared to compositions for use at room temperature cure.

10% w/w of the particles as coated above were added to the formulation above. The composition was mixed well for dispersal of the coated particles.

Bonds Formed Using a Composition of the Invention

The composition thus formed was used to bond a peripheral gold bumped die to a corresponding tracked FR4 board.

We used "Finetech" flip-chip bonding equipment, a manual flip-chip bonder from Finetech Electronic in Berlin Germany to assemble some bonds between these two electronic components, under the following cure parameters: Chuck head temperature 100° C.; Platform temperature 30° C.; Bonding Pressure 40N.

After 5 seconds at 100° C. we observed that the composition was cured.

The resistance through the bond was measured using an Ohmmeter, with the resistance varied between 500 and 1000 mΩ.

On the basis of the above the conductive pathway desired through the cured material has been achieved at a desired speed and at a desirable temperature. The bonds have also proven to be anisotropically conductive and durable as desired.

What is claimed is:

1. An anisotropic conductive bond, formed from a curable composition comprising a substantially homogeneous mixture of:
   (i) an amount of a first substantially uncured curable component; and
   (ii) conductive particles coated with the cured product of a second curable component.

2. The anisotropic conductive bond according to claim 1 wherein at least one of the first substantially uncured curable component and the second curable component is a cyanoacrylate.

3. The anisotropic conductive bond according to claim 1 wherein one of the first substantially uncured curable component or the second curable component is a (meth)acrylate and the other is a cyanoacrylate.

4. The anisotropic conductive bond according to claim 1 wherein the second curable component comprises methyl cyanoacrylate and the first curable component comprises ethyl cyanoacrylate.

5. The anisotropic conductive bond according to claim 1 wherein the particles are present in amount of from about 0.1 to about 30% by volume with respect to the volume of the first component.

6. The anisotropic conductive bond according to claim 1 wherein the coating on the particles is in the range from about from 0.8 to about 2.2 µm in thickness.

7. The anisotropic conductive bond according to claim 1 having a maximum thickness of about 15 µm.

8. The anisotropically conductive bond of claim 1 formed between adjacent electronics components.

9. A microelectronic assembly comprising at least two adjacent electronics components bonded together by the anisotropic conductive bond of claim 1.

10. The anisotropic conductive bond according to claim 1 further comprising a sufficient amount of a stabilising component to provide the curable composition with storage stability at ambient temperature and a cure temperature above 40° C.

11. The anisotropic conductive bond according to claim 1 wherein the first curable component is a cyanoacrylate; the second curable component is a cyanoacrylate and further comprising a sufficient amount of a stabilising component to provide the curable composition with storage stability at ambient temperature and a cure temperature above 40° C.

12. An electronic assembly comprising the anisotropic conductive bond according to claim 1, including:
   a first electronics component having a plurality of electrically conductive portions separated by an electrically insulating portion;
   a second electronics component having a plurality of electrically conductive portions separated by an electrically insulating portion, at least some of the second component electrically conductive portions generally aligned with respective electrically conductive portions on the first electronics component;
   the anisotropic conductive bond according to claim 1 between at least some electrically conductive portions of the first electronics component and the second electronics component, wherein particles of the curable composition form an anisotropically conductive path only between respective aligned electrically conductive portions on the first and second electronics components.

13. The assembly of claim 12 wherein the curable composition comprises a sufficient amount of a stabilizer to provide the curable composition with storage stability under ambient conditions and a cure temperature above 50° C.

14. The assembly of claim 12 wherein the first curable component is a first cyanoacrylate and the second curable component is a second cyanoacrylate different from the first cyanoacrylate.

15. The assembly of claim 12 wherein the first curable component is in a substantially cured condition.

16. The assembly of claim 12 wherein the curable component is substantially electrically insulative except between respective aligned electrically conductive portions on the first and second electronics components.

17. The assembly of claim 12 wherein one of the first or second electronics components comprises a semiconductor chip.

18. A method of making an electronic assembly including the anisotropic conductive bond of claim 1 comprising:

providing a first electronics component having a plurality of electrically conductive portions separated by an electrically insulating portion;

placing the curable composition of claim 1 on a portion of the first electronics component, providing a second electronics component having a plurality of electrically conductive portions separated by an electrically insulating portion;

orienting the second electronics component to the first electronics component so that at least some of the electrically conductive portions of each electronics component are generally aligned;

placing the second electronics component adjacent the first electronics component so that the curable composition is disposed between the generally aligned conductive portions, forming an anisotropically conductive path only between respective generally aligned electrically conductive portions on the first and second electronics components; and exposing the curable composition to a temperature of at least 50° C. to cure the first curable component and form the anisotropic conductive bond of claim 1 between at least some portions of the first electronics component to the second electronics component.

19. The method of claim 18 wherein the step of exposing comprises exposing the curable composition to a temperature of at least 80° C.

20. The method of claim 18 wherein the step of forming comprises breaking the coating of particles between respective generally aligned electrically conductive portions on the first and second electronics components.

\* \* \* \* \*